United States Patent
Schmid

(10) Patent No.: US 9,991,933 B2
(45) Date of Patent: Jun. 5, 2018

(54) ATTENUATOR AND SIGNAL GENERATOR FOR STEPWISE ATTENUATING A RADIO FREQUENCY SIGNAL

(71) Applicant: Rohde & Schwarz GmbH & Co. KG, Munich (DE)

(72) Inventor: Simon Schmid, Munich (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 424 days.

(21) Appl. No.: 14/714,688

(22) Filed: May 18, 2015

(65) Prior Publication Data

US 2016/0344447 A1 Nov. 24, 2016

(51) Int. Cl.
*H03H 7/24* (2006.01)
*H04B 3/466* (2015.01)

(52) U.S. Cl.
CPC ............. *H04B 3/466* (2013.01); *H03H 7/24* (2013.01)

(58) Field of Classification Search
CPC ... H01P 1/22; H03H 7/24; H03H 7/25; H03H 7/253; H03H 7/255
USPC ...................... 333/81 A, 81 R; 327/308, 309
See application file for complete search history.

(56) References Cited

U.S. PATENT DOCUMENTS

| | | | | | |
|---|---|---|---|---|---|
| 4,216,445 | A | * | 8/1980 | Abajian | H01P 1/22 333/109 |
| 4,978,932 | A | * | 12/1990 | Gupta | H01P 1/22 327/313 |
| 5,648,740 | A | * | 7/1997 | Devlin | H03H 11/245 327/308 |
| 2005/0093606 | A1 | * | 5/2005 | Kaiser, Jr. | H03H 11/245 327/308 |
| 2005/0156685 | A1 | * | 7/2005 | Hauger | H01P 1/22 333/81 R |
| 2008/0258833 | A1 | | 10/2008 | Richt et al. | |
| 2014/0055210 | A1 | * | 2/2014 | Black | H04B 1/525 333/132 |
| 2015/0326205 | A1 | * | 11/2015 | Cho | H03H 11/245 333/81 R |

FOREIGN PATENT DOCUMENTS

DE 102005002780 8/2006

* cited by examiner

*Primary Examiner* — Stephen E Jones
(74) *Attorney, Agent, or Firm* — Lee & Hayes, PLLC

(57) ABSTRACT

The invention relates to an attenuator for stepwise attenuating a radio frequency signal. The attenuator comprises a first attenuation module that is configured to stepwise attenuate a radio frequency signal within a first signal frequency range. The attenuator comprises a second attenuation module that is configured to stepwise attenuate a radio frequency signal with a second signal frequency range, wherein the second attenuation module is arranged in parallel to the first attenuation module. The attenuator further comprises a switching element, wherein the switching element switches either the first attenuation module or the second attenuation module to an output node of the attenuator.

15 Claims, 4 Drawing Sheets

ATTENUATOR AND SIGNAL GENERATOR FOR STEPWISE ATTENUATING A RADIO FREQUENCY SIGNAL

FIELD OF THE INVENTION

The invention relates to an attenuator for stepwise attenuating a radio frequency signal, short: RF signal. The invention further relates to a signal generator for stepwise attenuating an RF signal.

BACKGROUND OF THE INVENTION

In a radio frequency signal transmission system, there is a need for providing signal sources with a great variety of signal types and adjustable parameters to investigate the behavior of an RF device under test, short: DUT. To provide such signal sources, signal generators are used. RF signal generators are used for testing components, receivers and test systems in a wide variety of applications including cellular communications, WiFi, WiMAX, GPS, audio and video broadcasting, satellite communications, radar and electronic warfare. RF and microwave signal generators normally have similar features and capabilities, but are differentiated by frequency range. RF signal generators typically range from a few Kilohertz to some Gigahertz, while microwave signal generators cover a much wider frequency range, from less than 1 Megahertz to at least tens of Gigahertz. Some modules go up to about hundred Gigahertz when used with external waveguide source modules. RF and microwave signal generators can be classified further as scalar or vector signal generators. In the following, the term RF signal covers both radio frequency signals and microwave signals.

In order to be suitable for the maximum possible number of such investigating- or measuring-applications of a DUT, the signal generator must provide an extremely wideband radio frequency range with very high frequency resolution.

To properly investigate the behavior of a DUT, RF signals with an adjustable attenuation or amplification signal amplitude need to be generated.

An RF attenuator is an electronic device that reduces the power of a signal without appreciably distorting its waveform.

An attenuator is effectively the opposite of an amplifier, though the two work by different methods. While an amplifier provides gain, an attenuator provides loss, or gain less than 1. Hereinafter, the term "attenuator" does not exclude an amplifying function of an attenuator.

Currently-available signal generators are specified to provided either RF signals or microwave signals depending on their frequency range.

In document US 2008/0258833 A1, a signal generator is described that comprises a common level adjustment device for a low frequency range signal path and a high frequency range signal path. Problematic with such a common level-adjustment device is the inability to operate radio frequencies of a wide range of frequencies, such as from DC to higher RF signals, such as tens of Gigahertz. Thus, either the lower frequency ranged signals or the higher frequency ranged signals are not attenuated properly.

Thus, there is a need for providing an RF attenuator which is useful in a wide range of applications and which can flexibly be used for different DUT testing scenarios. The RF attenuator should be useful to operate radio frequencies of a wide range of frequencies, such as from DC to higher RF signals, such as tens of Gigahertz. The attenuator should comprise an attenuation ramp of several decades of decibel.

SUMMARY OF THE INVENTION

According to a first aspect of the invention, an attenuator for stepwise attenuating a radio frequency signal is provided. The attenuator comprises a first attenuation module that is configured to stepwise attenuate a radio frequency signal within a first signal frequency range. The attenuator further comprises a second attenuation module that is configured to stepwise attenuate a radio frequency signal within a second signal frequency range, wherein the second attenuation module is electrically arranged in parallel to the first attenuation module. The second frequency range is different to the first frequency range. The attenuator further comprises a switching element, wherein the switching element switches either the first attenuation module or the second attenuation module to an output node of the attenuator.

The attenuator is specified by its attenuation, which is the ration between the output power level and the input power level of the applied RF signal. The attenuation is quoted in decibel. The stepwise attenuator may preferably be used to provide an accurate level to investigate a DUT's behavior. Thus, the stepwise RF attenuator is widely used in test systems, where the signal amplitude levels need to be changed. The attenuator comprises individual attenuation sections with a number of switchable signal paths in order to change the RF signal power level for certain amounts of attenuation values.

The attenuation accuracy is necessary in equipments which are tested to have a non-tolerance level on the nominal level of attenuation. The level and the height of losses and distortion of the attenuation of an attenuator vary with the frequency of the applied RF signal. This results from the frequency dependency of the components used in the RF-attenuator.

The inventive RF attenuator can thus be used to attenuate RF signals within a higher frequency range compared to the known level adjustment devices. The switching element is used to provide the attenuated signal to an output node. Thus, either the first attenuation module or the second attenuation module is chosen to attenuate a signal source signal to the output node for testing the DUT. Thus, the attenuator is built modular, wherein each specific attenuation module is individually designed and thus provides attenuation values of a high accuracy and without loss- or distortion-effects. This reduces the development and manufacturing costs and allows a high flexible use within signal generators applications.

Using the inventive modular concept, an attenuation step size of at six decibel is achieved, in which the RF signal can be handled without significant losses or distortions.

The switching element is preferably a complex switching element, such as a contactor element or a signal combiner.

In a preferred embodiment, the first signal frequency range is higher than the second signal frequency range. The stepwise attenuation of signals within higher frequencies requires different hardware elements than the stepwise attenuation of signals within lower frequencies. Using the inventive design, it is now possible to design a first attenuation module, capable of stepwise attenuating frequency signals within a high frequency range with components suitable to handle this frequency range without a significant influence of the signal to be attenuated, such as distortions, losses or phase shifts. In addition it is now possible to design a second attenuation module, capable of stepwise attenuating frequency signals within a low frequency range with components suitable to handle this frequency range without a significant influence of the signal to be attenuated, such as distortions, losses or phase shifts.

The first signal frequency range is within several Gigahertz up to about hundred Gigahertz. Preferably, the second signal frequency range is within DC up to several Gigahertz. The first frequency range of the first attenuation module might comprise an overlapping frequency range with the second frequency range of the second signal attenuation module in order to allow a smooth overlapping frequency range.

In a preferred embodiment, the first attenuation module comprises at least an attenuation section based on a PIN diode. A PIN diode is a diode with a wide, undoped intrinsic semiconductor region between a p-type semiconductor and an n-type semiconductor region. The wide intrinsic region is in contrast to an ordinary PN diode. The wide intrinsic region makes the PIN diode suitable for fast switching applications and high voltage power applications. A PIN diode operates under high-level injection. The intrinsic region is flooded with charge carriers from the p-region and the n-region. Once the charge reaches a certain level, the PIN diode will begin to conduct current. Similarly, the PIN diode will conduct current once the flooded electrons and holes reach an equilibrium point, where the number of electrons is equal to the number of holes in the intrinsic region.

At high frequencies, the PIN diode appears as a resistor whose resistance is an inverse function of its forward current. Thus, a PIN diode is suitable in an attenuation section of the first attenuation module as an amplitude modulator or output leveling device.

The PIN diode might be used, for example, as the bridge and shunt resistors in a bridged-T attenuation section. The PIN diode might as well be used in a SPNT-configuration to switch between fixed attenuator elements. Another common approach is to use the PIN diode as a termination connected to the 0 degree and −90 degree port of a quadrature hybrid (pi-structure). The RF signal to be attenuated in the first attenuation module is applied to an input port of the PIN diode and the attenuated result is taken from an isolation port of the PIN diode. The advantages of this approach over the bridged-T and pi-structure approaches are complementary PIN diodes, wherein bias drives are not needed. Thus, the same bias current is applied to both PIN diodes. Additionally, the loss in the attenuator equals the return loss of the terminations.

The PIN diode in the higher frequency ranged first attenuation module is advantageously used, since no saturation of the intrinsic zone of the PIN diode occurs due to low periodic times of the applied RF signal.

In a preferred embodiment, the first attenuation module comprises an inductance element to apply at least one bias current value. When the diode is forward biased, the injected carrier concentration is typically several orders of magnitude higher than the intrinsic level carrier concentration. Due to this high level injection, which in turn is due to the depletion process, the electric field extends deeply (almost the entire length) into the region. This electric field helps in speeding up of the transport of charge carriers from the p-region to the n-region, which results in faster operation of the Pin diode, making it a suitable device for high frequency operations. Under a zero or reverse bias current, the PIN diode has a very low capacitance value. The low capacitance will not pass much of an RF signal. Consequently, the PIN diode makes a good RF switch. By changing the bias current through a PIN diode, it is possible to quickly change its RF resistance.

Thus, the PIN diode should be biased with a bias current. This bias current is applied to the PIN diode via an inductor. In case the frequency of the RF signal decreases below the first frequency range, the inductors impedance becomes more and more resistive. That increase of resistance leads to unwanted propagation losses. Thus, the PIN diode is not suitable for attenuating of RF signal below the first frequency range.

In a preferred embodiment, the second attenuation module comprises at least an attenuation section based on a field effect transistor, short: FET. The FET is preferably based on Gallium-Arsenide, short GaAs or Gallium-Nitride, short: GaN. Preferably the FET is CMOS-technology based. Since the second attenuation module is used to attenuate RF signals of the lower second frequency range, the above-named drawbacks when using PIN diodes, can be avoided. Especially, no current biasing of the FET is needed. Thus, no increasing resistance of the bias inductance needs to be considered. Additionally, since the intrinsic zone of the Pin diode could not handle the RF signal due to saturation caused by the longer period time of the RF signal, the FET structure is useful for the RF signals within the lower second frequency range.

In a preferred embodiment the FET is controllable via a control voltage. The FET controls the flow of electrons or electron holes from a source-region to a drain-region by affecting the size and shape of a conductive channel created and controlled by the control voltage or lack of the control voltage applied across the gate and source terminals. This conductive channel is the stream through which electrons flow from the source-region to the drain-region. For either enhancement- or depletion-mode FETs, at a drain-to-source voltage much less than a gate-to-source voltage, changing the gate voltage will alter the channel resistance, and the drain current will be proportional to the drain voltage, referenced to the source voltage.

In a preferred embodiment, a digital step attenuator is arranged upstream in the first attenuation module and/or in the second attenuation module comprising a first step range. The first attenuation module and the second attenuation module might have only a few specific not-changeable attenuation values, such as minus thirty decibel per section of each attenuation module. Those values of attenuation might not be a sufficient level adjustment to DUTs, since there might be the need of smaller steps of attenuation. To obtain a variable RF attenuator, the digital step attenuator is arranged upstream. Thus, a continuously varying of the RF signals power level over several decades of decibel is possible.

In a preferred embodiment, the first attenuation module and/or the second attenuation module comprise a series connection of at least two attenuation sections, selectable via an attenuation switch. In a more preferred embodiment, the step range of each attenuation step in the first attenuation module and/or in the second attenuation module is fixed. The stepwise character of the RF attenuator might be obtained by a series connection of at least two fixed attenuation sections in each attenuation module that are activated and deactivated with controllable switches. The attenuator is preferably a passive device.

In a preferred embodiment, an amplifying element is arranged in the first attenuation module and/or in the second attenuation module. Thus, the output level of the attenuator can be further adjusted. In a preferred embodiment the amplifier element comprises a variable amplification to individually adjust the RF signal power level.

In a preferred embodiment, the first attenuation module and/or the second attenuation module comprises at least a third attenuation step, preferably a fixed attenuation section, which is selectable via an attenuation switch. Thus, the output level of the attenuator can be further adjusted and the total attenuation is further increased.

In a preferred embodiment, a signal source is applied to an input node of the attenuator, wherein in dependence on the RF signal's frequency either the first attenuation module or the second attenuation module is used. Thus, the attenuator in its modular form operates at the specific first attenuation module or second attenuation module in sole decency of the RF signal's frequency.

In a preferred embodiment, an input node splitting element is used to apply the signal from the signal source to the first attenuation module or the second attenuation module. Such a splitting element is a reversely used combining element and is useful for passively switching from the first attenuation module to the second attenuation module.

According to a second aspect of the invention, a signal generator for investigating a device under test is provided. The signal generator comprises a signal source for providing a radio frequency signal and an attenuator as described above for adjustment of the radio frequency signal power level.

In a preferred embodiment, the signal source comprises a phase-lock-loop. The phase lock-loop comprises a first output node that supplies a radio frequency signal within a first frequency range to the first input node of the attenuator. The phase lock-loop comprises a second output node that supplies a radio frequency signal within a second frequency range to the first input node of the attenuator.

BRIEF DESCRIPTION OF THE DRAWINGS

In the following, exemplary embodiments of the invention are described with reference to the drawings by way of example only. Those exemplary embodiments do not limit the scope of the invention. The same reference signs in different drawings indicate the same elements or at least the same functions unless otherwise stated. In the drawings.

DETAILED DESCRIPTION OF THE DRAWINGS

Figure 1:
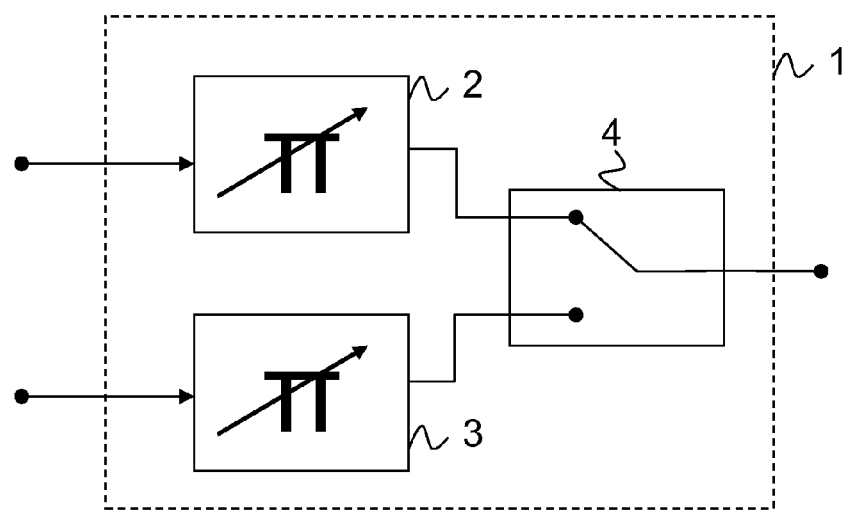
FIG. 1 shows a first exemplary embodiment of an attenuator according to the invention.

In FIG. 1, a first exemplary embodiment of an attenuator 1 according to the invention is shown. The attenuator 1 comprises a first attenuation module 2 which is arranged in parallel to a second attenuation module 3 in the attenuator 1. A switching element 4 combines the outputs of the first attenuation module 2 and the second attenuation module 3 to an output node of the attenuator 1. According to FIG. 1, the first attenuation module 2 comprises an input node for applying an RF signal within a first frequency range. The second attenuation module 3 comprises a further input node for applying an RF signal within a second frequency range. The first frequency range is higher than a second frequency range. Thus, in dependence on the frequency of an applied RF signal, either the first attenuation module 2 or the second attenuation module 3 is switched to an output node 4 via a switching element 4.

Since the first attenuation module 2 is arranged in parallel to the second attenuation module 3, the attenuator 1 according to the invention follows a modular concept. Thus it is possible to adapt the attenuator 1 to its specific application, especially to the RF signal's frequency, which should be applied to a DUT. Due to its modular frequency dependency of the specific attenuation modules 2, 3, the attenuator 1 can be designed more precise. The attenuator 1 is useful in a signal generator in order to provide an RF signal of highly adjustable and highly accurate RF signals amplitude, without using active devices and without losses and distortions.

Figure 2:
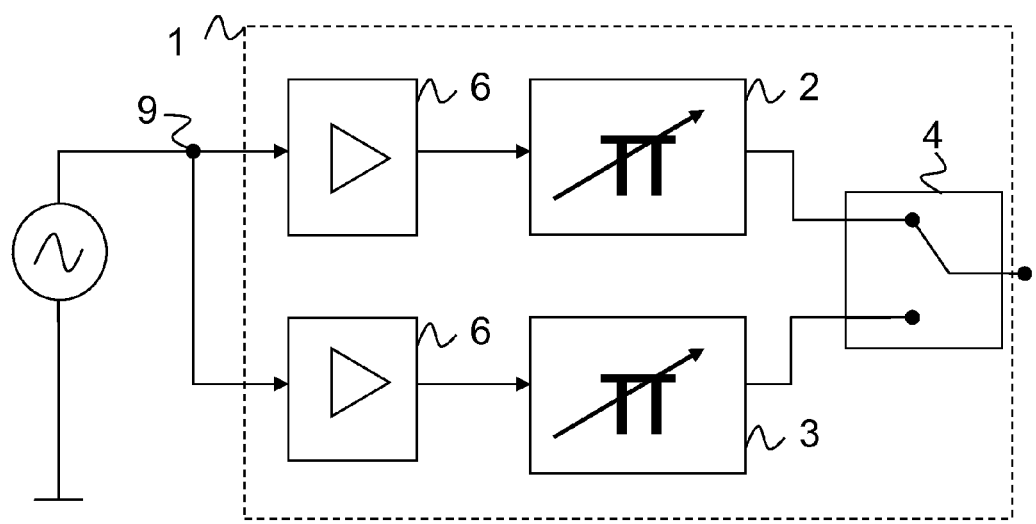
FIG. 2 shows a second exemplary embodiment of an attenuator according to the invention.

Now referring to FIG. 2, a second exemplary embodiment of the inventive attenuator 1 is shown. The attenuator 1 according to FIG. 2 comprises an amplifying element 6 in both the signal path of the first attenuation module 2 and the second attenuation module 3. Additionally, an input node splitter 9 is used to split a signal source's signal in dependence on its frequency to either the first attenuation module 2 or the second attenuation module 3. Such a splitter 9 is known per se and thus they are not described in greater details hereinafter. For example, a simple node or resistive splitter can be used. The amplifying element 6 is used to finally adjust the signal level which is applied to the output node of the attenuator 1.

Figure 3:
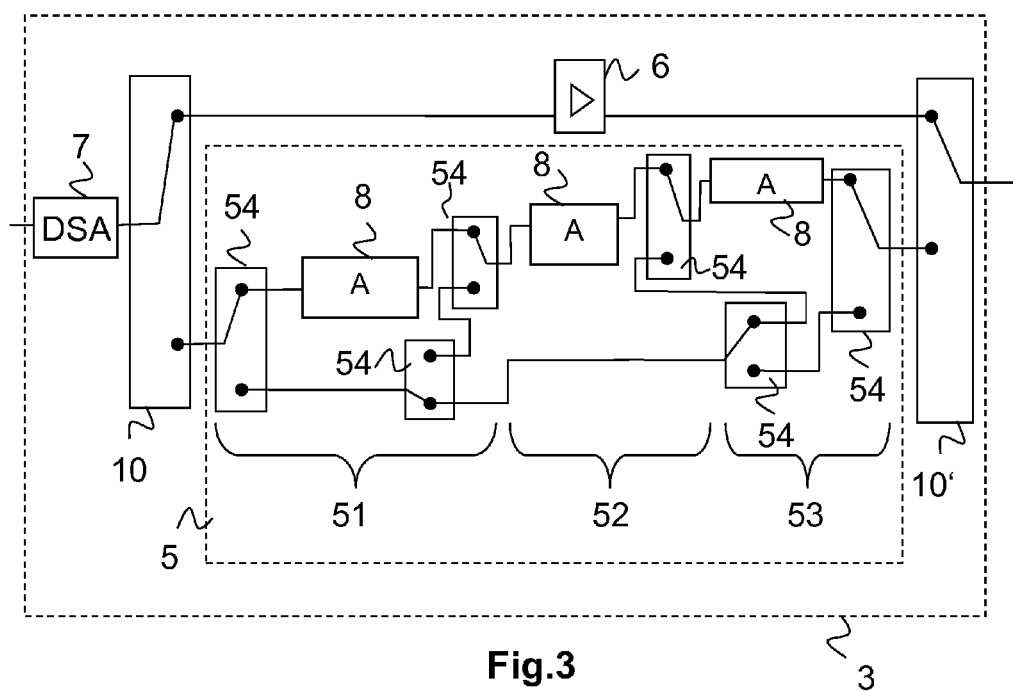
FIG. 3 shows an exemplary embodiment of a second attenuation module according to the invention.

In FIG. 3 an exemplary embodiment of a second attenuation module 3 is shown in greater details. The second attenuation module 3 of the inventive attenuator 1 comprises a digital step attenuator 7, short: DSA, on its input node. The DSA 7 comprises a variable attenuation range of a first value. For instance, the digital step attenuator 7 can be adjusted from zero decibel to minus thirty decibel in a step-size of one decibel. Other step-sizes and other ranges for the adjustment parameters of the DSA 7 are not excluded from the invention.

Subsequent to the DSA 7, module switches 10, 10' are used to provide the frequency signal to an attenuation arrangement 5 or to an amplifier element 6. In contrast to FIG. 2, the amplifying element 6 according to FIG. 3 is arranged in parallel to the attenuation arrangement 5. This leads to an attenuator 1, which can either be used to attenuate the RF signal's power level or to amplify the RF signal's power level, wherein this function is controllable via the module switches 10, 10'. The module switches 10, 10' are built in an identical manner and thus obtain the identical reference signs.

Figure 5:
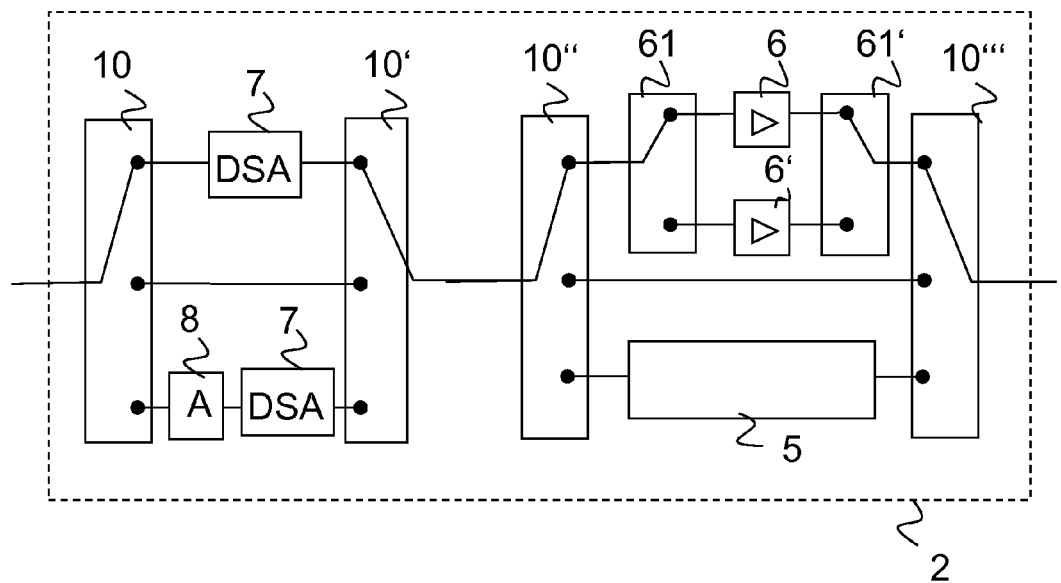
FIG. 5 shows an exemplary embodiment of a first attenuation module according to the invention.

Additionally and not shown in FIG. 3 the amplifying element 6 could be incorporated into a amplifying switching arrangement as shown in FIG. 5 to provide different amplification values. The specific amplifying element 6, 6' would by chosen by activating amplifier switches 61, 61' (not shown in FIG. 3).

Now referring to the attenuation arrangement 5 of FIG. 3, three attenuation sections 51, 52 and 53 are shown. Each attenuation section 51, 52, 53 of the attenuation arrangement 5 comprises two attenuation switches 54 and a fixed attenuation element 8. The fixed attenuation element is activated or deactivated with the two attenuation switches 54. Thus, three independent fixed attenuation elements 8 can be activated or deactivated in the used attenuation arrangement 5. Each fixed attenuation element preferably comprises a fixed attenuation value in decibel.

Preferably, all attenuation elements 8 comprise the same fixed attenuation value. Thus, the attenuation of the attenuator 1 doubles with activating the second attenuation element 8 and triples with activating all three attenuation elements 8.

Alternatively, all attenuation elements 8 comprise different fixed attenuation values, in order to obtain other overall attenuation values.

Preferably, the fixed attenuation value of the fixed attenuation elements 8 is identical to the maximum attenuation value of the DSA 7. Thus, having all attenuation sections 51, 52, 53 deactivated, the overall attenuation of the second attenuation module 3 depends on the DSA 7 value. For instance, the attenuation is adjustable from zero decibel to minus thirty decibel—in a step-range of one decibel.

Now, having only the first attenuation section 51 activated, the overall attenuation of the second attenuation module 3 depends on the DSA 7 value and the first attenuation section 51. For instance, the attenuation of the first attenuation section 51 is minus thirty decibel. Thus, the attenuation is adjustable from minus thirty decibel to minus sixty decibel in a step-range of one decibel.

Now, having only the first attenuation section 51 and the second attenuation section 52 activated, the overall attenuation of the second attenuation module 3 depends on the DSA 7 value, the first attenuation section 51 and the second attenuation section 52. For instance, the attenuation of the first attenuation section 51 and the second attenuation section 51 is equal and accounts minus thirty decibel each. Thus, the attenuation is adjustable from minus sixty decibel to minus ninety decibel in a step-range of one decibel.

Finally, having all attenuation sections 51, 52, 53 activated, the overall attenuation of the second attenuation module 3 depends on the DSA 7 value, the first attenuation section 51, the second attenuation section 52, the third attenuation section 53. For instance, the attenuation of the attenuation sections 51, 52, 53 is equal and accounts minus thirty decibel each. Thus, the attenuation is adjustable from minus ninety decibel to minus one-hundred-twenty decibel in a step-range of one decibel.

Thus, by subsequently activating each deactivated attenuation section 51, 52, 53 and using the above exemplary stated attenuation values, it is possible to adjust the power level of an input RF signal with an attenuation between 0 decibel and minus 120 decibel in a step-size of one decibel.

Figure 4:
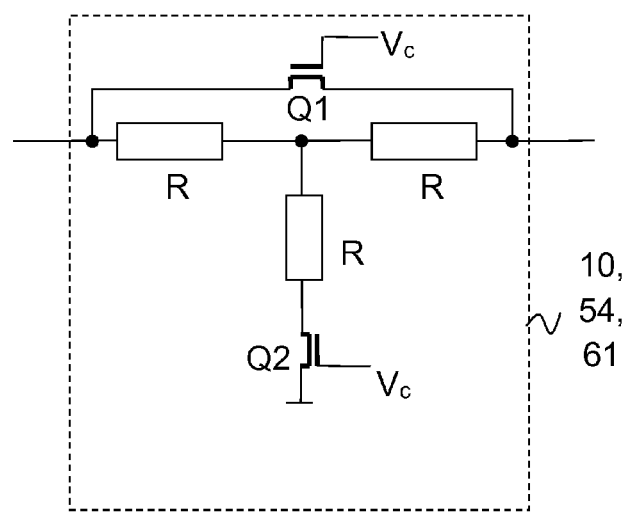
FIG. 4 shows a first exemplary embodiment of an attenuation switch or a module switch according to the invention.

In FIG. 4, a first exemplary embodiment of an attenuation switch 54, a module switch 10 or an amplifying switch 61 according to the invention is shown. Therein three resistance elements R arranged in a T-pad are used. The T pad is a specific type of attenuator circuit in electronics whereby the topology of the circuit is formed in the shape of the letter "T". The T pad is intrinsically an unbalanced circuit. However, it can be converted to a balanced circuit by placing half the series resistances in the return path. Such a circuit is called an H-section, or else an I section because the circuit is formed in the shape of a serifed letter "I".

Furthermore, two FETs Q1, Q2 are arranged to activated or deactivate the specific resistance elements R. The FETs Q1 and Q2 are switched via a control voltage $V_C$. Thus, it is possible to provide a respective high impedance or a low impedance state of the attenuation switch 54 or the module switch 10 by applying the respective control voltage $V_C$ value. FETs as switching devices have high parasitic capacitances, such as a gate-to-drain capacitance, which leads to a limit in a switching frequency. In order to avoid attenuation losses or non-linear frequency responses, the structure shown in FIG. 4 is only applicable to low frequency RF signals up to a few Gigahertz.

In FIG. 5, an exemplary embodiment of a first attenuation module 2 is shown. In contrast to FIG. 3, the DSA 7 is now incorporated in between two module switches 10, 10' which comprise three input nodes 101, 102, 103 and an output node 104. In between the first input node 101 of the module switches 10, 10', a DSA 7 is arranged. The second input node 102 of the power switching modules 10, 10' are directly connected. The third input node 103 of the module switches 10, 10' incorporates an attenuation element 8 and another DSA 7 in series connection. Since now the amplification of the DSA 7 is adjustable, the overall use of the attenuator 1 is more flexible.

Subsequent to the DSA 7 arrangement, another module switch 10", 10''' is arranged. At the first input node 101 of the module switch 10", 10''' amplifying elements 6, 6' are inserted. The amplifying elements 6, 6' comprise different amplification values. The specific amplifying element 6, 6' is chosen by activating amplifier switches 61, 61' respectively.

At the second input node 102 of the module switch 10", 10''' the attenuation arrangement 5 as basically shown in FIG. 3 is arranged. In contrast to FIG. 3, the attenuation arrangement 5 comprises attenuation switches 54 which are built without FETs. Instead, PIN diodes D according to FIG. 6 are used in the attenuation switches 54, the amplifier switches 61 and the module switches 10 of FIG. 5 in order to switch the specific signal path of the RF signal.

Figure 6:
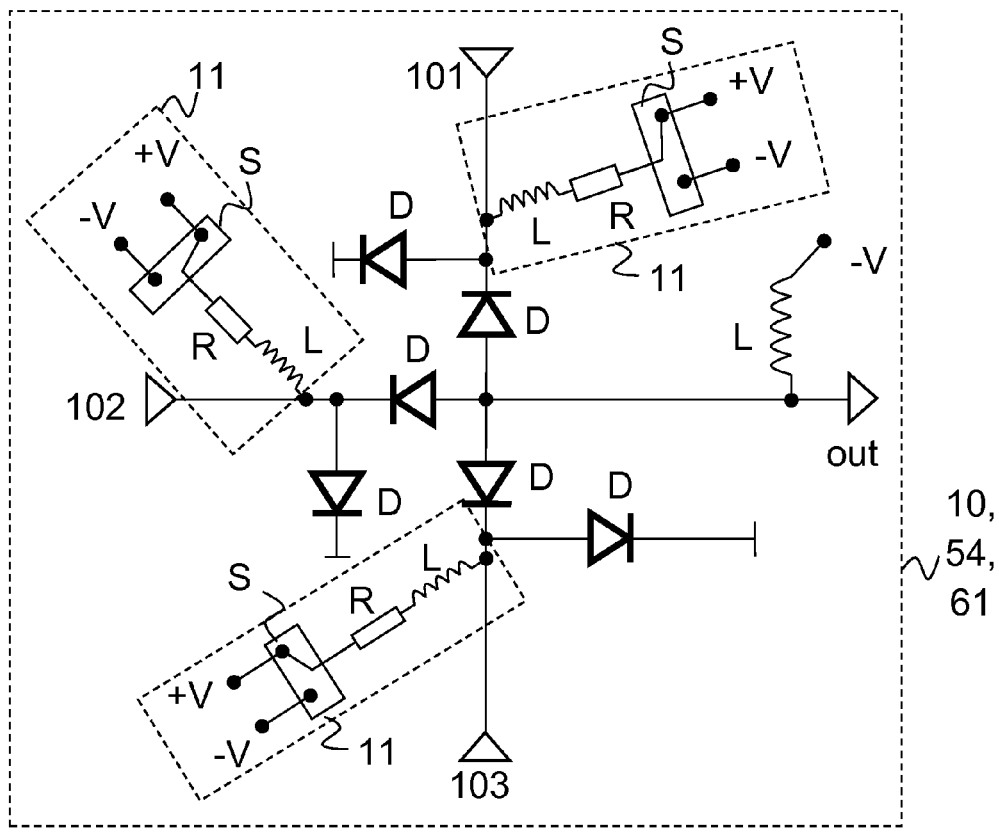
FIG. 6 shows a second exemplary embodiment of an attenuation switch or a module switch according to the invention.

In FIG. 6 a second exemplary embodiment of an attenuation switch 54, a module switch 10 or an amplifying switch 61 according to the invention is shown. In contrast to FIG. 4, no T-pad with FETs is used in order to allow high frequency switching. To allow a switching of frequencies above the second frequency range, PIN diodes D have to be used. As described above, the PIN diodes D need to be biased with a bias current in order to change their conducting state.

To supply the specific module switches 10, 10', 10", 10''', attenuation switches 54 or amplifier switches 61, 61' with the bias current a biasing arrangement 11 is used for each specific input node 101, 102, 103. The biasing arrangement 11 mainly comprises an inductance L and a resistance element R in series to a voltage switching element, that is able to supply a positive DC voltage value $V^+$ or a negative DC voltage value $V^-$ to the series connection of the resistance R and inductance L. The voltage switching element S is for instance applied to +5 Volts or −30 Volts in order to bias the specific PIN diode D.

The frequency to switch the module switches 10, 10', 10", 10''', attenuation switches 54 or amplifier switches 61, 61' needs to be sufficiently high in order to avoid that the inductive reactance $X_L$ of the inductance L obtains a significant resistive value.

Additionally, the PIN diode D obtains an intrinsic zone which is saturated in case the applied frequency signal comprises a period of time below a certain amount. To avoid the saturation and to further avoid the attenuation losses due to the increasing resistive value of the inductive reactance $X_L$, the PIN diode D cannot be used for low frequency investigations of a DUT.

Thus, the inventive attenuator 1 comprises the first attenuation module 2 and the second attenuation module 3 in parallel. The switching element 4 is used to switch the appropriate RF signal dependent on its frequency to the output node of the attenuator 1.

Figure 7:
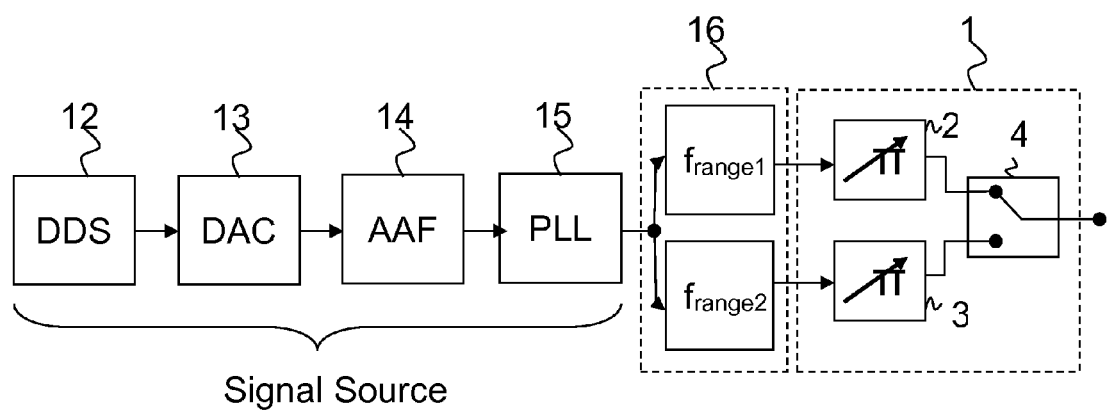
FIG. 7 shows an exemplary embodiment of a signal generator according to the invention.

In FIG. 7 an exemplary embodiment of a signal generator according to the invention is shown. A direct digital synthesis, short DDS, 12 obtains a clock-pulse signal of a fixed frequency value, for instance 100 Megahertz (not shown). This controls the DDS 12 and a subsequent connect digital-to-analog converter 13. An analog signal with a maximum frequency Megahertz is therefore connected to the input of an anti-aliasing filter 14. The anti-aliasing filter 14 is used to reduce inter-modulations, noise and harmonic multiples, which arise as a result of glitches at the output of the digital-to-analog converter 13.

A phase-lock-loop 15 is subsequently provided to the anti aliasing filter AAF 14. The PLL 15 comprises a phase detector, a filter, a voltage-controlled oscillator and a variable frequency divider in its forward loop of the PLL 15 (not shown).

In the block circuit diagram presented in FIG. 7, the PLL 15 is followed by an frequency splitter 16 for splitting the output dependent on the RF signal's frequency. A first output node supplies a RF signal within a first frequency range to the first input node of the attenuator 1. A second output node supplies a RF signal within a second frequency range to the first input node of the attenuator 1.

The output signal of PLL 15 can be supplied via a selector switch. At the selector's first output RF signals with a first frequency range from several Gigahertz to several tens of Gigahertz are provided. As mentioned above, the power level of these RF signal can be further attenuated by the first attenuation module 2 of the attenuator 1. At the selector's second output, RF signals within a second frequency range from DC to several Gigahertz are provided. As mentioned above, the power level of these RF signal can be further attenuated by the second attenuation module 3 of the attenuator 1. The output signal of the attenuator 1 is the output signal of the signal generator.

All features of all embodiments described, shown and/or claimed herein can be combined with each.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An attenuator for stepwise attenuating a radio frequency signal, wherein the attenuator comprises:
    a first attenuation module that is configured to stepwise attenuate a radio frequency signal within a first signal frequency range;
    a second attenuation module that is configured to stepwise attenuate a radio frequency signal with a second signal frequency range, wherein the second attenuation module is arranged in parallel to the first attenuation module; and
    a switching element, wherein the switching element switches either the first attenuation module or the second attenuation module to an output node of the attenuator,
    wherein:
        a signal source is applied to an input node of the attenuator;
        an input node splitting element is used to apply the signal from the signal source to the first attenuation module or the second attenuation module; and
        in dependence on the radio frequency signal's frequency either the first attenuation module or the second attenuation module is used.

2. The attenuator according to claim 1, wherein the first signal frequency range is higher in frequency than the second signal frequency range.

3. The attenuator according to claim 1, wherein the first attenuation module comprises at least an attenuation section having at least one PIN diode.

4. The attenuator according to claim 3, wherein first attenuation module comprises an inductance element to apply at least one bias current.

5. The attenuator according to claim 1, wherein the first attenuation module comprises at least an attenuation section having at least one field effect transistor.

6. The attenuator according to claim 5, wherein the field effect transistors is controllable via a control voltage.

7. The attenuator according to claim 1, wherein a digital step attenuation is arranged upstream in the first attenuation module and/or in the second attenuation module comprising a first step range.

8. The attenuator according to claim 7, wherein the step range of each attenuation step in the first attenuation module and/or in the second attenuation module is fixed.

9. The attenuator according to claim 1, wherein an amplifying element is arranged in the first attenuation module and/or in the second attenuation module.

10. The attenuator according to claim 9, wherein the amplifier element comprises a variable amplification.

11. The attenuator according to claim 1, wherein at least one of the first attenuation module or the second attenuation module comprise a series connection of at least two attenuation sections, selectable via an attenuation switch.

12. The attenuator according to claim 11, wherein at least one attenuation section of the at least two attenuation sections is a fixed attenuation section.

13. The attenuator according to claim 11, wherein at least one of the first attenuation module or the second attenuation module comprises at least a third attenuation section, which is selectable via an attenuation switch.

14. The attenuator according to claim 13, wherein at least one attenuation section of the at least two attenuation sections is a fixed attenuation section.

15. A signal generator for investigating a device under test, the signal generator comprising:
    a signal source for providing a radio frequency signal, wherein the signal source includes a phase-lock-loop, the phase-lock-loop comprising:
        a first output node that supplies a radio frequency signal within a first frequency range to the first input node of the attenuator; and
        a second output node that supplies a radio frequency signal within a second frequency range to the first input node of the attenuator; and an attenuator according to claim 1 for adjustment of the radio frequency signal power level.

* * * * *